United States Patent [19]
Jones et al.

[11] Patent Number: 6,140,217
[45] Date of Patent: Oct. 31, 2000

[54] TECHNIQUE FOR EXTENDING THE LIMITS OF PHOTOLITHOGRAPHY

[75] Inventors: Harris C. Jones, Stormville, N.Y.; James G. Ryan, Newtown, Conn.

[73] Assignee: International Business Machines Corporation, Armonk, N.Y.

[21] Appl. No.: 09/116,791

[22] Filed: Jul. 16, 1998

[51] Int. Cl.⁷ .................................................... H01L 21/44
[52] U.S. Cl. ........................ 438/597; 438/584; 438/639
[58] Field of Search ................................... 438/584, 597, 438/598, 618, 639, 637, 622, 688

[56] References Cited

U.S. PATENT DOCUMENTS

| | | | |
|---|---|---|---|
| 2,843,829 | 7/1958 | Slate . | |
| 2,962,393 | 11/1960 | Ruckelshaus . | |
| 4,406,062 | 9/1983 | Navarro . | |
| 4,641,420 | 2/1987 | Lee | 438/621 |
| 5,229,325 | 7/1993 | Park et al. . | |
| 5,262,352 | 11/1993 | Woo et al. | 438/625 |
| 5,275,973 | 1/1994 | Gelatos | 438/623 |
| 5,401,675 | 3/1995 | Lee et al. | 438/653 |
| 5,477,612 | 12/1995 | Roberts . | |
| 5,534,463 | 7/1996 | Lee et al. | 438/643 |
| 5,584,120 | 12/1996 | Roberts . | |
| 5,635,423 | 6/1997 | Huang et al. . | |
| 5,661,067 | 8/1997 | Lee et al. | 438/420 |
| 5,953,609 | 9/1999 | Koyama et al. | 438/253 |
| 5,960,318 | 9/1999 | Peschke et al. | 438/637 |

*Primary Examiner*—John F. Niebling
*Assistant Examiner*—Christopher Lattin
*Attorney, Agent, or Firm*—McGinn & Gibb, P.C.; Daryl K. Neff, Esq.

[57] ABSTRACT

A method of forming a wiring pattern in a device comprises forming an array of grooves in a mask, forming first spacers adjacent vertical walls of the grooves, removing the mask, forming second spacers adjacent the first spacers, and filling areas between the first spacers and areas between the second spacers with a material to form the wiring pattern.

15 Claims, 4 Drawing Sheets

6,140,217

1

TECHNIQUE FOR EXTENDING THE LIMITS OF PHOTOLITHOGRAPHY

BACKGROUND OF THE INVENTION

1. Field of the Invention

The present invention generally relates to semiconductor wiring and more particularly to methods to increase wiring density and to decrease wiring pitch and width within a semiconductor device.

2. Description of the Related Art

Conventional systems form wiring in a semiconductor device by many methods, such a photolithography/etching processes. More specifically, a common method for forming wiring includes depositing a light sensitive photoresist sacrificial mask film, on a substrate and patterning the mask material by exposing it to a light pattern. The light pattern which is exposed on the sacrificial film represents a positive or negative image of the desired wiring pattern. The exposed regions change composition, such that the unexposed areas of the mask have a different etching sensitivity than the exposed regions of the mask.

Once the mask material has been exposed to the wiring pattern of light, a etching process, such as reactive ion etching or chemical etching is performed to remove the exposed regions of a positive photoresist mask or to remove the unexposed regions of a negative photoresist mask. After the etching process, the mask represents a negative image of the desired wiring pattern. This etching process may also be extended to form wiring grooves in the substrate which match the desired wiring pattern.

If grooves are formed in the substrate, the mask is removed from the substrate in a stripping process leaving the bare substrate with a line-space array of wiring grooves. The wiring grooves are then filled with a conductive material, such as copper, and the structure is planarized such that the conductive material remains only within the wiring grooves and the substrate insulates the conductive wiring.

Alternatively, the pattern may be formed on a conductive material which is etched. The remainder of the mask is removed to leave a wiring pattern. Subsequently, an insulator is formed adjacent the wiring pattern to insulate the wiring.

This generally completes the formation of the wiring pattern. Additional wiring levels may be formed by repeating the steps described above. After wiring processes are completed, subsequent processing is then performed to complete the semiconductor device.

However, conventional methods of forming semiconductor wiring are limited by the resolution of the photolithography process. More specifically, the smallest light image which can be focused on the sacrificial mask represents the smallest size wire which can be produced. Similarly, the resolution of the photolithographic process limits the wiring pitch and density which can be formed in semiconductor devices.

SUMMARY OF THE INVENTION

It is, therefore, an object of the present invention to provide a structure and method for reducing the size of the wires and increasing the wiring density within a semiconductor device. The invention achieves these goals by using a sacrificial (insulating) layer to effectively double the number of copper lines within a layer of wiring. The invention also exploits the process control for certain deposited films and controls the thickness and conformality of the deposit films better than conventional lithography.

2

DETAILED DESCRIPTION OF PREFERRED EMBODIMENTS OF THE INVENTION

Figure 1A:
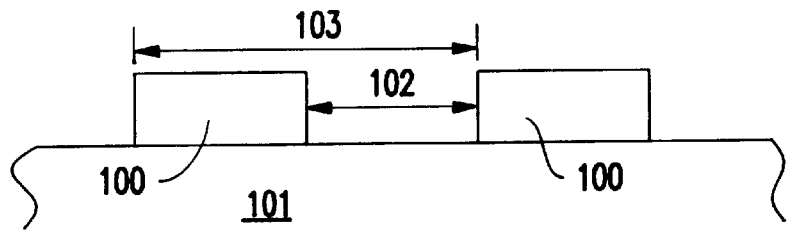
FIGS. 1A–1G are schematic diagram of cross-sectional views of the stages of development of a semiconductor wiring pattern according to the invention.

Referring now to the drawings, and more particularly to FIG. 1A, a line/space pattern is produced by photolithography on a sacrificial mask layer, using conventional methods, as discussed above. The mask is then reactive ion etched (RIE) and the exposed (or unexposed) portions photoresist are removed to form a damascene land-groove array or line-space array 100 of grooves 102 on a semiconductor substrate 101. The profile of the grooves 102 in the sacrificial layer 100 is generally vertical.

Figure 1B:
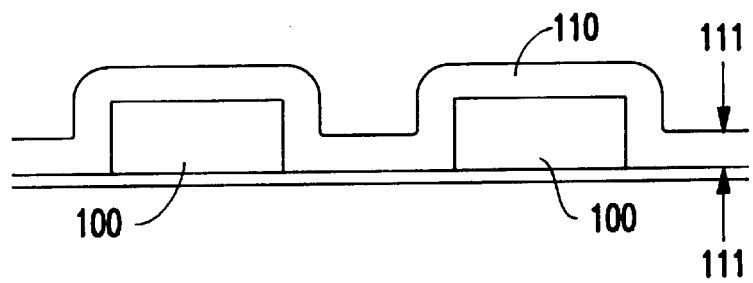

This is the pattern that would conventionally be filled with a conductive material, such as copper, in for a copper damascene process. However, the invention breaks away from conventional teachings and, instead of filling the grooves 102 with a conductive material, the grooves 102 are coated with a conformal insulator 110 that can be etched selectively to the sacrificial layer and the underlying insulator 100, as shown in FIG. 1B. The thickness 111 of this conformal insulator is preferably formed at ⅛th the pitch 103 of the line-space array (FIG. 1A).

Figure 1C:
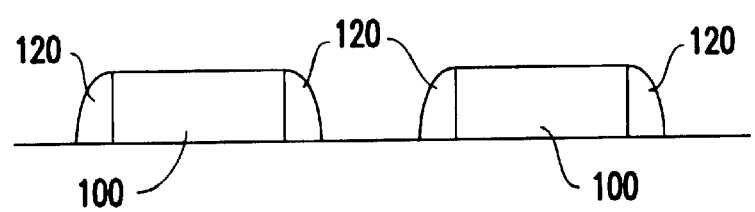

The conformal insulator 110 is then etched in a controlled RIE to allow a portion of the conformal insulator 110 to remain on the sides of the insulator mask 100 to form sidewall spacers 120 on the sacrificial insulator mask 100, as shown in FIG. 1C.

Figure 1D:
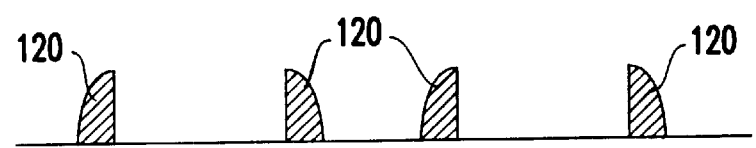

The sacrificial layer 100 is then removed in a process which does not affect the sidewall spacers 120, resulting in the structure shown in FIG. 1D. As mentioned above, the sidewall spacers 120 and the sacrificial mask 100 are selectively etchable. Therefore, the sacrificial mask 100 can be etched using a process which does not effect the sidewall spacers 120. For example, if the sacrificial mask 100 is a photoresist it can be ashed, or if the sacrificial mask 100 is borosilicate glass (BSG) it can be wet or dry etched, leaving the sidewall spacers 120 intact, as shown in FIG. 1D.

Typically, the first RIE etching of the first conformal layer 110 would have a selectivity greater than 1, so that only the conformal layer 110 is etched and the sacrificial mask 100 is not etched. The wafer would go through a wet etch or a second RIE process to remove the sacrificial layer 100, leaving the spacers 120 intact.

Figure 1E:
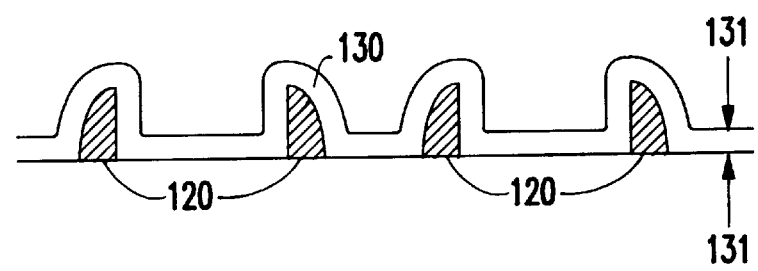

Referring to FIG. 1E, the sidewall spacers 120 are then coated with a second conformal layer 130 which may or may not be identical to the first layer. The thickness 131 of the second conformal layer 130 has preferably about the same thickness 111 of the first layer 110.

Figure 1F:
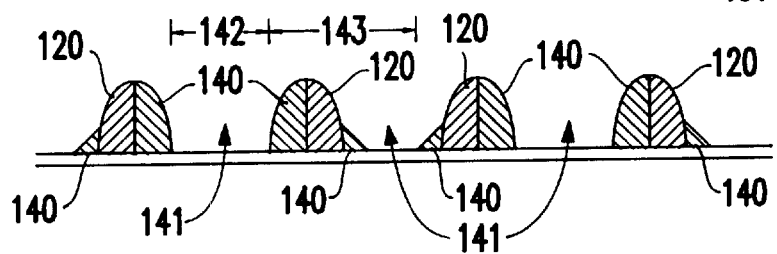

The second layer 130 is then etched in the same manner as the first layer, as shown in FIG. 1C, to produce the second sidewall spacers 140 adjacent the first sidewall spacers 120, as shown in FIG. 1F. The etching of the conformal layer can be extended (e.g., overetching) to some degree to tailor the width of the insulating lines (e.g., sidewall spacers 120, 140) and similarly tailor the width of the conductive wiring formed between the insulating lines, as discussed below.

The result of the foregoing process produces an array of lands (insulating lines) 120/140 and grooves (spaces) 141 which have a through width 142 which is about ¼ the pitch 103 of the line-space array attainable with conventional photolithography ground rules shown in FIG. 1A. Thus, the wiring array created with the invention has approximately ½ the pitch 143 of the smallest possible pitch 103 attainable using conventional lithography tools.

Figure 1G:
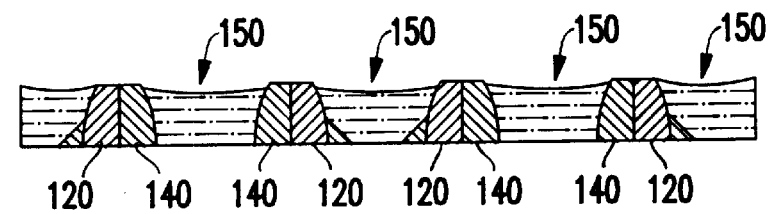

As shown in FIG. 1G, the spaces 141 can be filled with a conductive material 150 and polished using the conventional, well known, processes such as damascene processing.

The materials used in this embodiment are well known to those ordinarily skilled in the art. For example, the sacrificial insulating mask 100 can comprise any suitable sacrificial material, such as SIO2, Si3N4, BPSG (boron—phosphorus silicate glass) or any other dielectric material that forms vertical sidewalls when being reactive ion etched. The conformal layers 110, 130 or wiring layer 150, can comprise insulators or conductors, as discussed in greater detail below. For example, suitable insulators preferably include, Si3N4, SiO2 or any another dielectric material that has etch selectivity to the sacrificial layer 100, and etch selectivity to the base layer substrate 101. Similarly, suitable conductors can include copper, aluminum, polysilicon or aluminum—copper alloys.

With respect to the deposition method of the conformal layers 110, 130, processes well known to those ordinarily skilled in the art, such as standard insulator deposition processes of SiO2 and Si3N4, are generally very well controlled and can produce a consistently thick layer across all surfaces. For example, the thickness uniformity of the conformal layer 110, 130 can be controlled to within, for example, 5% or less of the desired thickness (e.g., thickness 111 and 131). Thus, it is possible for the width of the base of the resulting sidewall spacer 120, 140 to have a precision that is equal to or better than what conventional photolithography can provide.

In other words, in addition to producing wiring having a smaller pitch and producing more wires per unit of measure, the invention also produces wiring having a more consistent thickness (e.g. higher precision) then what is available with conventional lithographic means.

Figure 2A:
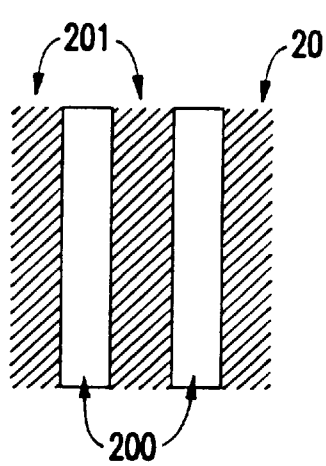
FIG. 2A is a schematic diagram of a plan view of a conventional wiring pattern.
Figure 2B:
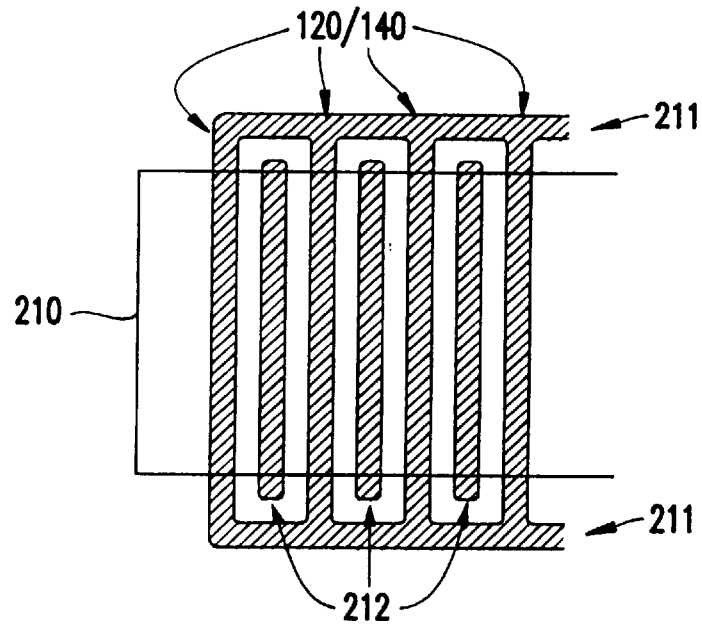
FIG. 2B is a schematic diagram of a plan view of a wiring pattern formed according to the invention.

FIGS. 2A–2B illustrate plan views which compare a conventionally formed line array in FIG. 2A with the inventive line array illustrated in FIG. 2B. More specifically, FIG. 2A illustrates a substrate 201 and the smallest wiring lines 200 which can be formed by conventional lithographic processes. To the contrary, FIG. 2B illustrates the decrease in pitch of the inventive wiring lines 212 separated by the conformal insulating layers 120/140.

Blockout masks 210 or other similar conventional method well known to those ordinarily skilled in the art can be used to trim the ends 211 of the wires 212.

In another embodiment, the first conformal layer 120 can comprise a conductive material instead of an insulator. This embodiment, illustrated in FIGS. 3A–3C includes the layer 120 as conducting lines which are covered by an insulator (e.g., the second conformal layer 130) forming insulating lines 130 with a conductive core 120. This embodiment provides a very high density of very narrow conductor lines (for low current signal applications, for example).

This embodiment is similar to the first embodiment of the invention up to the process illustrated in FIG. 1E. However, instead of etching the second conformal layer to the point shown in FIG. 1F, the second conformal layer 130 is minimally overetched to remove only the horizontal surfaces and leave the sidewall spacers on both sides of the conformal layer 120 intact.

Figure 3A:
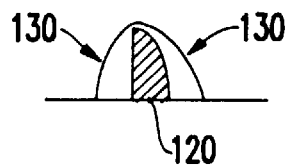
FIGS. 3A–3C are schematic diagrams of cross-sectional views of a semiconductor device formed according to the invention.
Figure 3B:
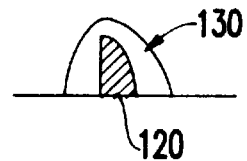

More specifically, FIG. 3A illustrates a process where the second conformal layer 130 is attached to the top of the conformal layer 120. To the contrary, FIG. 3B illustrates a process where the second conformal layer 130 is etched less than in FIG. 3A, so that the first conformal layer 120 is completely covered by a thicker second conformal layer 130.

Figure 3C:
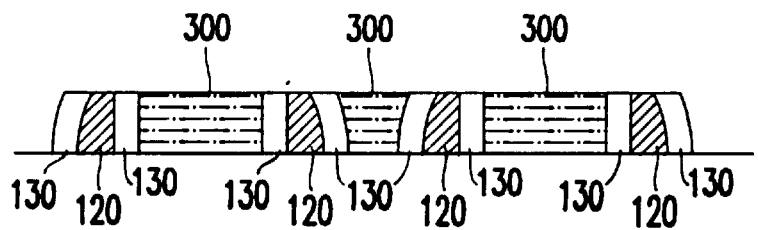

Then, as illustrated in FIG. 3C, the wafer is preferable coated with a conductive material 300, such as copper, and chemically-mechanically polished to produce a planar structure. This structure illustrated in FIG. 3C has four times the number of wires per unit of area as could be formed with conventional photoresist techniques.

Figure 4A:
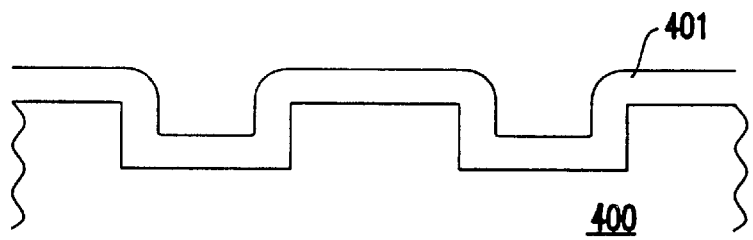
FIGS. 4A–4C are schematic diagrams of cross-sectional views of a semiconductor device formed according to the invention.
Figure 4B:
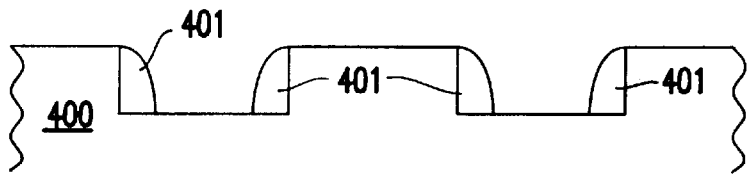
Figure 4C:
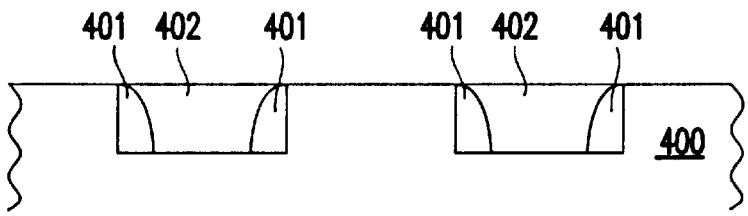

In another embodiment, illustrated in FIGS. 4A–4C, the groove array pattern is formed in the substrate using the conventional techniques discussed in the background section. Conductive sidewall spacers are formed by depositing a conformal conductive layer 401 over the etched substrate 400, as shown in FIG. 4A. The conductive layer 401 is etched to form sidewall spacers, as discussed with the previous embodiments, within the grooves, as shown in FIG. 4B. A second insulating conformal layer 402 is deposited between the conductive spacers 401 and the structure is planarized, as illustrated in FIG. 4C. This embodiment of the invention produces wiring having a smaller width and higher density that is obtainable with conventional photolithographic techniques.

Figure 5A:
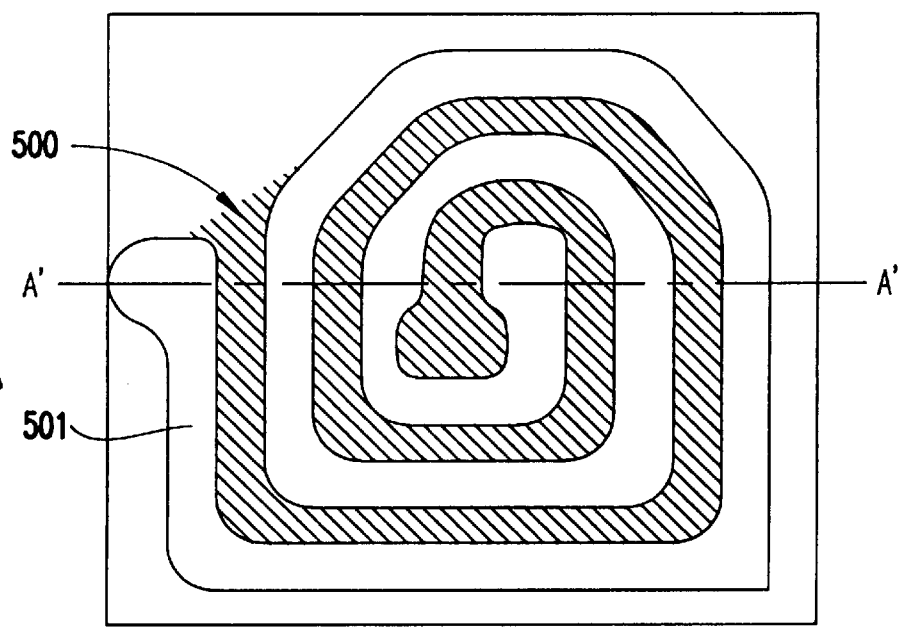
FIGS. 5A–5B are schematic diagrams of a plan view of a conventional coil.
Figure 5B:
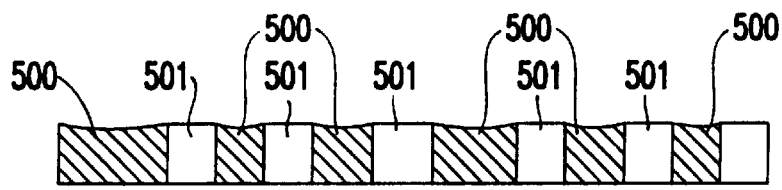
Figure 6A:
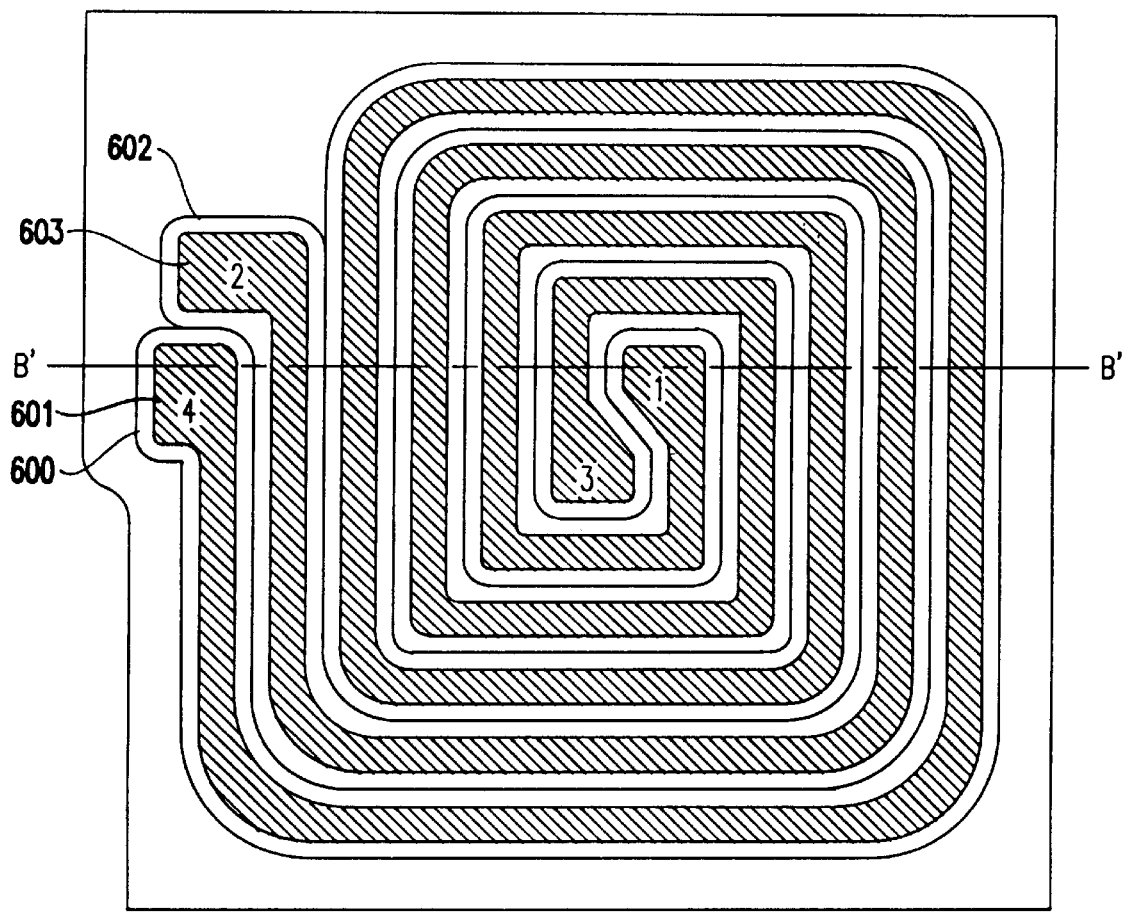
FIGS. 6A–6B are schematic diagrams of a plan view of a coil formed according to the invention.
Figure 6B:
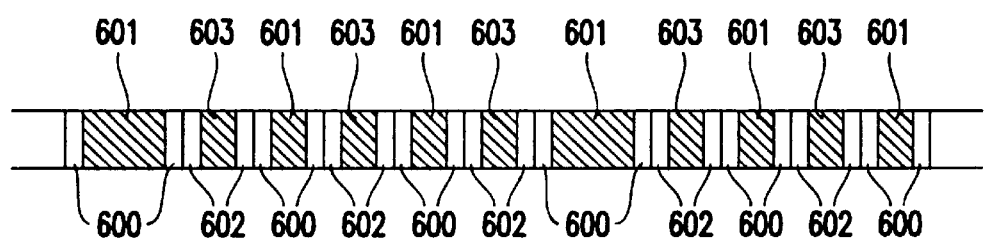

The foregoing embodiments are further explained with the following examples. FIGS. 5A–5B illustrate a conventional planar magnetic detector coil for a hard drive head or an on-chip detector and FIGS. 6A–6B illustrate the same structure formed according to the invention. The standard damascene construction of such a coil would be known by one ordinarily skilled and the art, given this disclosure. Therefore, many of the details of the structure's formation are omitted so that the features and advantages of the invention can be clearly illustrated.

Briefly, as shown in FIGS. 5A and 5B a helix shape is exposed on an photoresist (not illustrated). The helix shape is etched into the photoresist and then etched into the substrate. A conductive material 500, such as copper, is deposited in the pattern formed in the substrate and polished using standard processes, such as the copper damascene process. The remainder of the photoresist is removed and the copper wire coil 500 is then encapsulated in an insulator 501. Contact is made to the center and edge ends of the coil by standard dual damascene processing. FIGS. 5A and 5B illustrate a conventional N-turn coil, wherein two turns occupy about $36a^2$ of surface, where a is the pitch.

FIGS. 6A and 6B illustrate the same coil formed according to the invention. Such a coil includes twice the number of turns (and twice the sensitivity) when compared with the coil illustrated in FIGS. 5A and 5B.

More specifically, a similar helix shape is patterned on a sacrificial layer (not illustrated). However, instead of filling the groove pattern with a conducted material as was done in FIGS. 5A, 5B, insulating sidewall spacers 602 are formed along the vertical sides of the grooves. The sacrificial layer is then removed and second insulating spacers 600 are formed adjacent the first insulating spacers 602. Then the grooves between the insulating spacers 600, 602 are filled with a conducted material which forms conducting lines 601, 603 and the structure in planarized.

These coils are encapsulated in an insulator and connected by standard dual damascene techniques. The center contact of one coil can be preferable connected to the edge contact of the other coil and the other two contacts can be preferably used for input/output.

As is illustrated in FIGS. 6A and 6B, a coil having 2N turns (and about twice the sensitivity) has been created in the same space as before. Also, the two center connectors can be tied together to create a very high resistance/low inductance bridge.

Thus, as described above, the invention illustrated in FIGS. 6A–6B includes wiring having ½ the pitch and twice the density of the smallest, most dense wiring obtainable using conventional lithographic techniques.

As would be apparent to one ordinarily skilled in the art given this disclosure, the line width at the center of the coils and the ends of the coils are preferably increased so that the contact areas meet the surface and overlay requirements. Similarly, the expose dose and etch bias can be optimized so that both conductive lines 601, 603 have identical cross-sections (e.g., matching resistance) as determined by design needs. Further, other manufacturing concerns can be conventionally addressed by isolating the coil with a blockout mask or surrounding the sacrificial layer with a non-sacrificial one.

The invention is not limited to the embodiments described above and is useful with any type of wiring application that involves optimizing the contact density. For example, semiconductor layouts are commonly based on a square array of contacts. This may be a simple array or a body centered cubic array.

Figure 7:
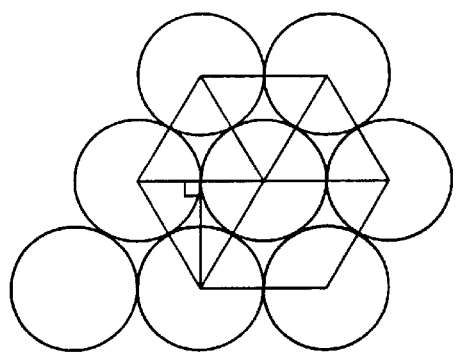
FIG. 7 is a schematic diagram hexagonal close-packed array.

However, square arrays are not the most dense arrays. Instead, hexagonal, closed packed arrays are the most dense arrays. In the hexagonal close packed array, the minimum dimensions between shapes, for example contact vias, are at 60 degree angles, as shown in FIG. 7.

Conventionally it was not possible to connect adjacent contacts without violating minimum photolithographic ground rules because the line width or pitch would have to be 0.866 times smaller than the minimum photolithographic dimension. However, since the invention allows the creation of reduced pitch wiring, a line-space array having dimensions of 2×0.866a=1.732a can be formed using the process disclosed above to create lines that would make connections to adjacent studs or contacts possible.

This example demonstrates that the invention, which allows the wiring density to increase by more than 15% without changing photo ground rules, or conversely a less critical mid-ultra violet photolithography (MUV) may be used for certain line levels that would normally require a more critical deep ultra violet lithography (DUV).

While the invention has been described in terms of single preferred embodiments, those skilled in the art will recognize that the invention can be practiced with modification within the spirit and scope of the appended claims.

Having thus described my invention, what I claim as new and desire to secure by Letters Patent is as follows:

1. A method of forming a wiring pattern in a device comprising:
    forming an array of grooves in a mask;
    forming first spacers adjacent vertical walls of said grooves;
    removing said mask;
    forming second spacers adjacent said first spacers; and
    filling areas between said first spacers and areas between said second spacers with a material to form said wiring pattern.

2. The method as in claim 1, wherein said material comprises a conductor, said first spacers and said second spacers comprising insulators.

3. The method as in claim 1, wherein said material comprises copper formed in a copper damascene process, said first spacers and said second spacers comprising insulators.

4. The method as in claim 1, wherein at least one of said first spacers and said second spacers comprises a conductor, said material comprising an insulator.

5. The method as in claim 1, wherein said step of forming said first spacers comprises steps of:
    depositing a conformal material over said mask and in said grooves; and
    selectively removing a portion of said conformal material such that said conformal material is removed from horizontal surfaces and remains on vertical surfaces.

6. The method as in claim 5, wherein said depositing step comprises forming said conformal layer to have a thickness approximately equal to ⅛ a width of said grooves.

7. The method as in claim 1, wherein said step of forming said second spacers comprises steps of:
    depositing a conformal material over said first spacers and said substrate; and
    etching said conformal material such that said conformal material has a shape and size approximately equal to said first spacers and said conformal material is adjacent said first spacers.

8. The method as in claim 1, wherein said material comprises a wiring material and said step of forming said second spacers comprises steps of:
    depositing a conformal material over said first spacers and said substrate; and
    etching said conformal material such that said conformal material covers said first spacers and grooves exist between adjacent ones of said second spacers,
    wherein said first spacers and said wiring material comprise conductors.

9. A method of forming a wiring pattern in a device comprising:
    forming an array of grooves in a mask above a substrate;
    depositing a first conformal material over said mask and in said grooves;
    selectively removing a portion of said conformal material such that said first conformal material is removed from horizontal surfaces and remains on vertical surfaces, said first conformal material comprising first spacers;
    removing said mask;
    depositing a second conformal material over said first spacers and said substrate; and
    selectively removing a portion of said second conformal material such that said second conformal material comprises second spacers; and
    filling areas between said first spacers and areas between said second spacers with a third material to form said wiring pattern.

10. The method as in claim 9, wherein said first conformal material and said second conformal material comprise insulators and said third material comprises a conductor.

11. The method as in claim 9, wherein at least one of said first conformal material and said second conformal material comprise conductors and said third material comprises an insulator.

12. The method as in claim 9, wherein said second conformal material insulates said first spacers from said third material and said first spacers and said third material comprise conductors.

13. A method of forming a wiring pattern comprising:

forming an array of grooves in a substrate;

forming spacers along vertical walls of said grooves; and filling areas between said spacers with a material to form said wiring pattern, wherein said spacers comprise conductors and said material comprises an insulator.

14. The method as in claim 13, wherein said spacers comprise insulators and said material comprises a conductor.

15. The method as in claim 13, wherein said step of forming said spacers comprises steps of:

depositing a conformal material over said substrate and in said grooves; and selectively removing a portion of said conformal material such that said material is removed from horizontal surfaces and remains on vertical surfaces.

* * * * *